United States Patent [19]

Moutrie et al.

[11] Patent Number: 5,546,275

[45] Date of Patent: * Aug. 13, 1996

[54] ELECTRICAL MODULE MOUNTING APPARATUS

[75] Inventors: Michael F. Moutrie, Buffalo Grove; Andrew Whitmore, III, Arlington Heights; David M. Hess, Elgin; John C. Laugal, South Barrington; Steven M. Mina, Vernon Hills; Matthew J. Boler, Inverness, all of Ill.

[73] Assignee: Motorola, Inc., Schaumburg, Ill.

[*] Notice: The portion of the term of this patent subsequent to Sep. 23, 2014, has been disclaimed.

[21] Appl. No.: 490,257

[22] Filed: Jun. 14, 1995

Related U.S. Application Data

[63] Continuation of Ser. No. 311,336, Sep. 23, 1994, Pat. No. 5,459,640.

[51] Int. Cl.⁶ .................................................. H05K 7/20
[52] U.S. Cl. .................. 361/707; 165/185; 174/16.3; 361/753; 361/809; 361/814; 361/825
[58] Field of Search ................................ 361/687–688, 361/690, 704, 707, 709–722

[56] References Cited

U.S. PATENT DOCUMENTS

| 4,504,886 | 3/1985 | Cygan et al. | 361/721 |
| 5,045,971 | 9/1991 | Ono et al. | 361/704 |
| 5,353,192 | 10/1994 | Nordin | 174/16.3 |
| 5,373,101 | 12/1994 | Barabolak | 174/35 R |
| 5,379,185 | 1/1995 | Griffin et al. | 174/16.3 |

FOREIGN PATENT DOCUMENTS

| 2249299 | 10/1990 | Japan | 361/720 |

*Primary Examiner*—Gregory D. Thompson
*Attorney, Agent, or Firm*—Randall S. Vaas

[57] ABSTRACT

An electrical module (125) is for mounting upon a circuit board (104). During circuit assembly, the electrical module (125) is placed upon a breakaway portion (117) of the circuit board (104) and a bracket assembly (103) is mounted to the circuit board (104) so as to position the electrical module (125). At the conclusion of circuit assembly, final assembly is initiated and the breakaway portion (117) is removed and the circuit board (104) is mounted into a housing (105). Preferably, the electrical module (125) is in direct contact with the housing (105) so as to maximize heat transfer.

14 Claims, 3 Drawing Sheets

5,546,275

ELECTRICAL MODULE MOUNTING APPARATUS

This is a continuation of application Ser. No. 08/311,336 filed on Sep. 23, 1994 now U.S. Pat. No. 5,459,640.

BACKGROUND OF THE INVENTION

This invention relates generally to circuit board assemblies and, more particularly, to a method and apparatus for mounting an electrical module on a circuit board.

A byproduct of normal operation of an electrical circuit is thermal energy, i.e., heat. Thermal energy is generated as a result of frictional effects of charge flow during operation of the electrical circuit. Greater charge flows, i.e., larger currents, generate a greater buildup of thermal energy. If not properly dissipated, a buildup of thermal energy can cause undesirable operating characteristics in the electrical circuit, and can even cause damage to the components of the electrical circuit, as well as components of other proximate circuits.

Generation of thermal energy is particularly significant in amplification devices such as, for example, a power amplifier. Because power amplifiers often amplify the input signals supplied thereto, signals output by the power amplifier can be many times the amplitude of the input signals. However, the efficiency of a typical power amplifier is only about 40% and therefore, about 60% of the input electrical energy supplied to these amplifiers is converted into thermal energy. In order to prevent damage from occurring to the power amplifier (as well as to other proximately positioned components), it is necessary to dissipate this thermal energy by thermally coupling the power amplifier to a heat sinking element. Due to the large amount of thermal energy generated by the operation of these power amplifiers, heat dissipation can be readily accomplished by using the metal housing, which contains the substrate on which the power amplifier is mounted, as a heat sinking element. By creating a thermally conductive path between the power amplifier and the metal housing, thermal energy contained in, or generated during the operation of, the power amplifier can be conducted to the metal housing and dissipated by convection.

It is known to mount a power amplifier such that its thermal energy is conducted to the metal housing. For example, the power amplifier is mounted on, and electrically connected via solder to, a metal plate attached to a circuit board that physically contacts the metal housing. Therefore, a thermally conductive path of power amplifier-solder-metal plate-chassis is realized. Unfortunately, the presence of the metal plate, which is sandwiched between the power amplifier and the circuit board, degrades heat transfer between the power amplifier and metal housing.

An additional mounting difficulty of known power amplifier assemblies occurs during automated electrical circuit assembly. The power amplifier must be removed from the automated process to undergo a separate "manual" mounting sub-process. For example, it is known to manually attach a metal plate to the circuit board and hand solder the power amplifier onto the top of the metal plate while the leads of the power amplifier are also hand soldered to corresponding pads on the circuit board. Only after the completion of this manual sub-process can the circuit board with the power amplifier be re-injected into the automated assembly process. The requirement of a separate assembly sub-process significantly increases production costs.

Therefore, a need exists for an improved method and apparatus for mounting an electrical module on a circuit board which facilitates automated circuit assembly.

DETAILED DESCRIPTION OF THE PREFERRED EMBODIMENTS

The present invention provides methods and apparatuses for mounting an electrical module, such as a radio frequency (RF) power amplifier, in a circuit board assembly. A conforming bracket assembly and an electrical module are supported upon a breakaway portion of a circuit board during automated circuit assembly. During final assembly, the breakaway portion of the circuit board is removed and the circuit board is mounted into a metal housing. The opening left by the removal of the breakaway portion permits the metal housing to be placed in direct contact with the electrical module; thus, allowing for maximum heat transfer between the electrical module and the metal housing. In addition, the conforming bracket assembly provides a reliable connection between the ground of the electrical module and the ground of the circuit board so as to allow the electrical module to function consistently.

Figure 1:
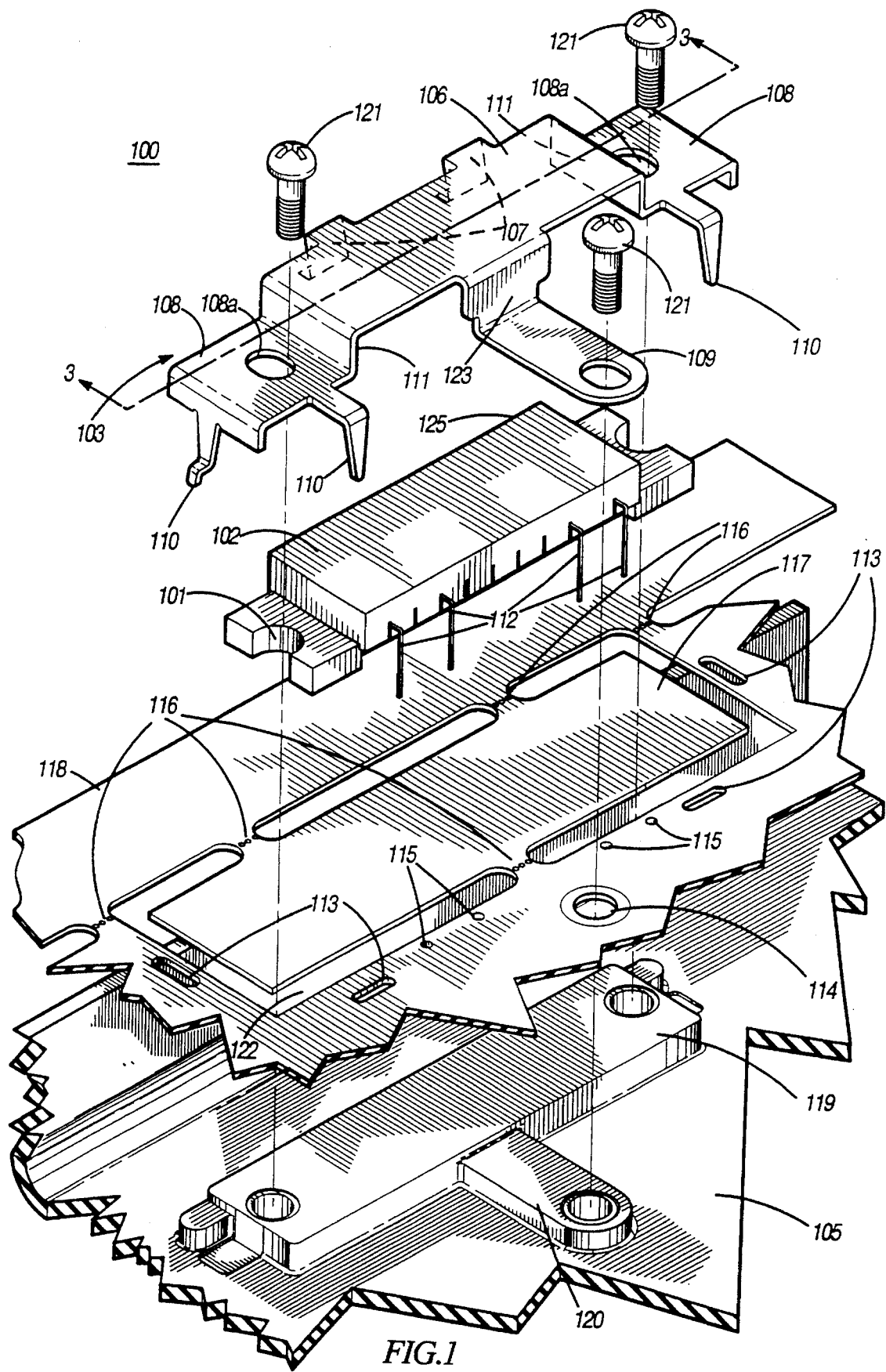
FIG. 1 illustrates a fragmentary exploded perspective view of the circuit board assembly of the present invention.

FIG. 1 illustrates an exploded perspective view of a circuit board assembly 100 embodying the present invention. The circuit board assembly 100 includes a circuit board 104, an RF power amplifier module 125, a bracket assembly 103 and a metal housing 105. The circuit board 104 may be one panel of a multi-panel assembly of the kind known to be utilized in an automated production environment. Such multi-panel assemblies may be comprised of copper and fiber glass.

The circuit board 104 is attached to a rail 118. The rail 118 is typically comprised of the material comprising the multi-panel assemblies. During automated circuit assembly, which may be accomplished by waveline soldering or reflow heating, the rail 118 contacts the conveyor and prevents mounted circuit components of the circuit board 104 from coming into contact with the conveyor. At the conclusion of automated circuit assembly, the rail 118 is broken away from the circuit board 104 by applying a torsional force to a plurality of breakaway legs, such as perforated breakaway legs 116, that attach the circuit board 104 to the rail 118.

The circuit board 104 includes a removable breakaway portion denoted by a breakaway tab 117 occupying a notch 122 of the circuit board 104. The breakaway tab 117 is connected to the circuit board 104 by one perforated breakaway leg 116 and also connected to the rail 118 by two perforated breakaway legs 116. The breakaway legs 116 prevent the breakaway tab 117 and the RF power amplifier module 125 seated thereon from being displaced should the circuit board 104 and the rail 118 sag or bow excessively during automated circuit assembly. Such sagging or bowing may occur during automated circuit assembly of multi-panel assemblies (utilizing rail edges for conveyor contact) because of the high temperatures associated with soldering and/or the heavy weight of mounted circuit components.

Figure 2:
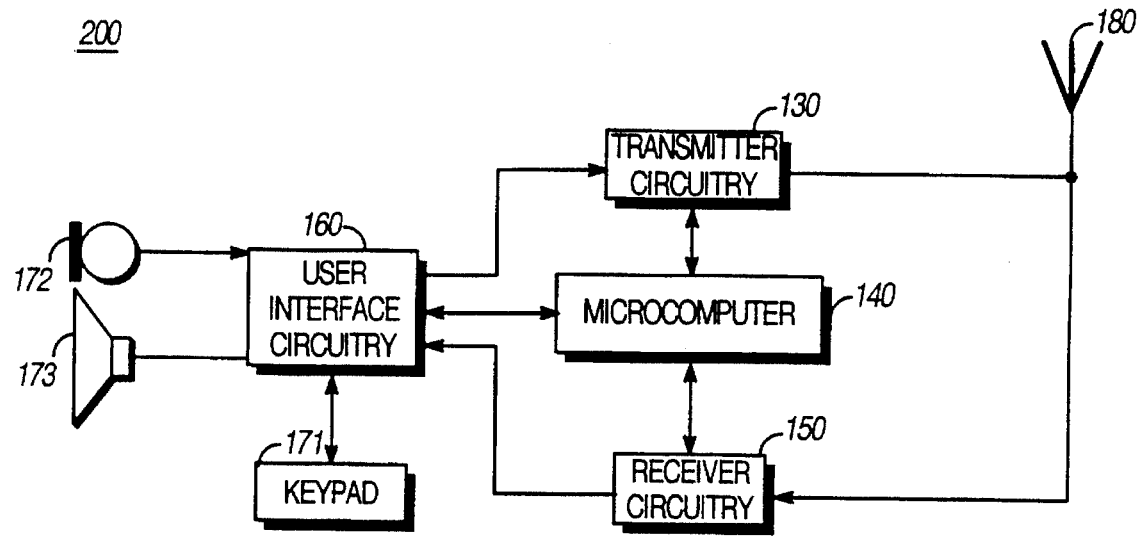
FIG. 2 illustrates a cross-sectional view of the circuit board assembly according to a preferred embodiment of the present invention taken along section lines 2—2 in FIG. 1.

The breakaway tab 117 is dimensioned to correspond to the bottom face surface of the RF power amplifier module 125. Such dimensioning allows the RF power amplifier module to be adequately supported during automated circuit assembly. During final assembly and after removal of the breakaway tab 117, the bottom face surface of the RF power amplifier module 125 is placed in direct contact with the metal housing 105 as best illustrated in FIG. 2; thus, maximizing heat transfer between the RF power amplifier module 125 and the metal housing 105.

Tooled at predetermined locations about the periphery of the notch 122 are a plurality of pads realized as metal-plated throughholes, such as receptacle holes 115, grounded receptacle slots 113, and a ground pad 114 that is circumscribed about a screw hole. The grounded receptacle slots 113 and the ground pad 114 are electrically attached via traces (not shown) of the circuit board 104. During final assembly, the metal housing 105 is attached to the electrical ground plane (not shown) of the circuit board 104 via the ground pad 114.

The RF power amplifier module 125 is comprised of an amplifier (not shown) enclosed within a plastic cover 102 further disposed on a metallic heatsink 101. The illustrated RF power amplifier module 125 is a 6 watt RF Power Amplifier Module (part no. 15J02) manufactured by Motorola Corporation; however, the assembly may be advantageously employed with any commercially available RF power amplifier. The heatsink 101 includes notches disposed at opposite longitudinal ends. During final assembly and after removal of the breakaway tab 117, the notches of the heatsink 101 permit passage of screws 121 used to secure the bracket assembly 103 and the RF power amplifier module 125 to the metal housing 105.

The RF power amplifier module 125 further comprises four leads 112 extending from the amplifier (not shown) through openings in the cover 102. Although the four leads 112 are shown, it will be recognized that the amplifier may include fewer, or additional leads. The leads 112 extend in a downward orthogonal orientation permitting engagement with the receptacle holes 115 when the RF power amplifier module 125 is seated upon the circuit board 104 during automated circuit assembly. Alternatively, the leads 112 could merely extend outward from the amplifier, such that when the RF power amplifier module 125 is seated, the leads 112 would lie across pads; the pads being disposed upon the circuit board 104 in place of the receptacle holes 115.

The bracket assembly 103 may be fabricated from tin-plated, cold rolled steel, using a known technique such as progressive metal stamping, having a thickness of approximately 0.025 inches. The bracket assembly 103 includes a raised, planar, generally rectangular central plate 106. Sides 111 extend orthogonally from opposite longitudinal ends of the plate 106. Flanges 108 extend outwardly from the sides 111. Each of the flanges 108 includes an end foot member 110a having an outward extending, curved toe 110b that locks the bracket assembly 103 into the corresponding grounded receptacle slots 113 during automated circuit assembly. Each of the flanges 108 also includes a front foot member 110 for insertion into corresponding grounded receptacle slots 113 so as to further engage corresponding grounded receptacle slots 113 in circuit board 104 during automated circuit assembly. Each of the flanges 108 further includes an aperture 108a for receipt of a screw 121 during final assembly.

An arm 123 extends generally orthogonally from a front edge of the plate 106. A flange 109 extends generally orthogonally from the arm 123. The flange 109 includes an aperture 109a for receipt of a screw 121 during final assembly.

The bracket assembly 103 further includes retaining dips 107 that extend downwardly from a rear edge of the plate 106. Although two retaining dips 107 are illustrated, one or more than two retaining clips 107 may be advantageously employed. The retaining clips are substantially "Z"-shaped so as to prevent the top edge of the rear of the cover 102 of the RF power amplifier module 125 from shifting in a downward direction into the opening left by the removal of the breakaway tab 117; such removal occurs during final assembly.

The bracket assembly 103 substantially conforms to the shape of the RF power amplifier module 125 and, thus, aids in alignment of the RF power amplifier module 125 during circuit assembly. The plate 106, the sides 111, the arm 123, and the retaining clips 107 limit lateral movement of the RF power amplifier module 125 during automated circuit assembly. The plate 106 is dimensioned to correspond to the top surface of the cover 102 while the sides 111, the arm 123 and the retaining clips 107 partially enclose the side of the cover 102.

The metal housing 105 may be comprised of die-cast aluminum or other material capable of withstanding heat transfer. The metal housing 105 includes an integrally formed, raised large platform 119. The top surface of the large platform 119 and the heatsink 101 of the RF power amplifier module 125 are dimensioned such that the heatsink 101 has a foot print similar to the top surface of the large platform 119. When assembled, the large platform 119 protrudes through the opening left by the removal of the breakaway tab 117. This permits direct seating of the RF power amplifier module 125 upon the large platform 119 permitting maximum heat transfer between the RF power amplifier module 125 and the metal housing 105.

The metal housing 105 further includes an integrally formed, raised small platform 120 that resides on a horizontal plane that is vertically lower than that of the large platform 119. The small platform 120 preferably extends one circuit board thickness (e.g., 1.6 mm) below the large platform 119. The small platform 120 is further dimensioned to permit snug seating of the ground pad 114 of circuit board 104 upon the small platform 120 during final assembly.

FIG. 2 illustrates a cross-sectional view of the circuit board assembly 100 of FIG. 1 that can be fabricated during an automated circuit assembly process, such as waveline soldering or reflow heating, and a final assembly process utilizing the following method. The automated circuit assembly process is initiated by subjecting the multi-panel circuit board assembly, containing the circuit board 104, to a known screening procedure which impregnates the grounded receptacle slots 113 and the receptacle holes 115 with a solder paste or a suitable alternative.

The RF power amplifier module 125 is then placed on the circuit board 104. The downward extending leads 112 of the RF power amplifier module 125 fit into the corresponding receptacle holes 115 so as to ensure proper positioning of the RF power amplifier module 125 on the circuit board 104. The position of the RF power amplifier module 125 is thus self-aligned by the leads 112. Once positioned, the containment of the leads 112 by the receptacle holes 115 prevents unwanted shifting of the RF power amplifier module 125 during the automated circuit assembly process. Power amplifier modules having outward extending leads, which require attachment to surface pads via hand soldering, generally demand additional fixturing for positioning purposes during the circuit assembly process.

Upon placement, the RF power amplifier module 125 is supported and relieved of strain by the breakaway tab 117. Due to the relatively substantial size, weight and thermal by-product of RF power amplifier modules, circuit boards must be designed to provide support during circuit assembly while preserving access to a heatsinking means during final assembly. Prior art RF power amplifier modules were typically supported by additional means, for example, a metallic plate, fitted to a pre-cut notch; the notch later permitting access to the metallic housing during a final assembly stage.

Next, the bracket assembly 103 is positioned on the top of the RF power amplifier module 125 in a manner that is also self-aligning. Because the bracket assembly 103 substantially conforms to the shape of the RF power amplifier module 125, the positioning of the bracket assembly further ensures proper alignment of the RF power amplifier module 125 upon the circuit board 104. The front foot members 110 and the end foot members 110a fit into the corresponding grounded receptacle slots 113 and restrict the movement of the RF power amplifier module 125 within the confines of the similarly dimensioned bracket assembly 103. In addition, the curved toe 110b of the end foot members 110a prevents the bracket assembly 103 from vertically detaching once inserted.

The circuit board 104 upon which the RF power amplifier module 125 and the bracket assembly 103 are positioned then undergoes soldering, such as waveline or reflow soldering. Soldering electrically connects the leads 112 of the RF power amplifier module 125 to the receptacle holes 115 and the front foot members 110 and the end foot members 110a, including the curved toe 110b of the bracket assembly 103, to the grounded receptacle slots 113. Attachment of prior art RF power amplifier modules generally required hand or robot soldering to attach planarly extending leads to circuit board pads.

Once automated circuit assembly is completed, final assembly is instituted. Initially, the rail 118 and the breakaway tab 117 are unattached from the circuit board 104 exposing the bottom surface of the heatsink 101 of the RF power amplifier module 125. A torsional force is applied to the rail 118 until the perforated breakaway legs 116 are broken and the rail 118 can be separated from the circuit board 104 and discarded. Similarly, a downward (so as not to displace the RF power amplifier module 125) torsional force is applied to the breakaway tab 117 until the perforated breakaway legs 116 between the breakaway tab 117 and the circuit board 104 are broken. The breakaway tab 117 can then be separated from the notch 122 and discarded.

Next, the circuit board 104 is mounted in metal housing 105 such that the RF power amplifier module 125 contacts the large platform 119 through the opening left by the removal of the breakaway tab 117. The RF power amplifier module 125 is secured to the large platform 119 by driving the screws 121 through the apertures 108a of the flanges 108 of the bracket assembly 103 and end notches of the heatsink 101 into corresponding threaded holes located on opposing ends of the large platform 119. Screws can be applied by an automated screw machine. Attachment of the heatsink 101 directly to the large platform 119 maximizes heat transfer by creating a direct thermal connection between the RF power amplifier module 25 and the metal housing 105.

By further securing the circuit board 104 to the metal housing 105, a reliable ground connection between the RF power amplifier module 125 and the circuit board 104 is established. The screw 121 can be passed through the aperture 109a of the bracket assembly 103 and the hole around which the ground pad 114 of the circuit board 104 is circumscribed as well as terminated in a threaded hole in the small platform 120. Besides effectively attaching the bracket assembly 103 and the metal housing 105 to the electrical ground of the circuit board 104, intimate RF grounding between the RF power amplifier module 125 (electrical contact between the flanges 108 of the bracket assembly 103, the heatsink 101, and the screws 121) and the circuit board 104 (the front foot members 110 and the end foot members of the bracket assembly 103 are electrically attached to the grounded receptacle slots 113) is also accomplished. This reliable electrical connection promotes consistent performance and stability for the operation of the RF power amplifier module 125.

At the conclusion of final assembly, the preferred embodiment of the assembled circuit board assembly 100 is adequately illustrated by FIG. 2. The bracket assembly 103 resides on the top of the RF power amplifier module 125 and the sides 111 extend downwardly from the plate 106 and substantially enclose the cover 102 of the RF power amplifier module 125. The flanges 108 extend orthogonally outward from the sides 111 on a lower plane that is parallel to a plane 326 formed by the plate 106. The end foot members 110a extend downwardly from the flanges 108 and fit into the grounded receptacle slots 113 of the circuit board 104. Bracket assembly 103 can further provide electromagnetic shielding of potential RF radiation because it substantially encloses the RF power amplifier module 125 and is electrically grounded. Maximum heat transfer is realized from the direct seating of the heatsink 101 of the RF power amplifier module 125 upon the large platform 119 of the metal housing 105.

Figure 3:
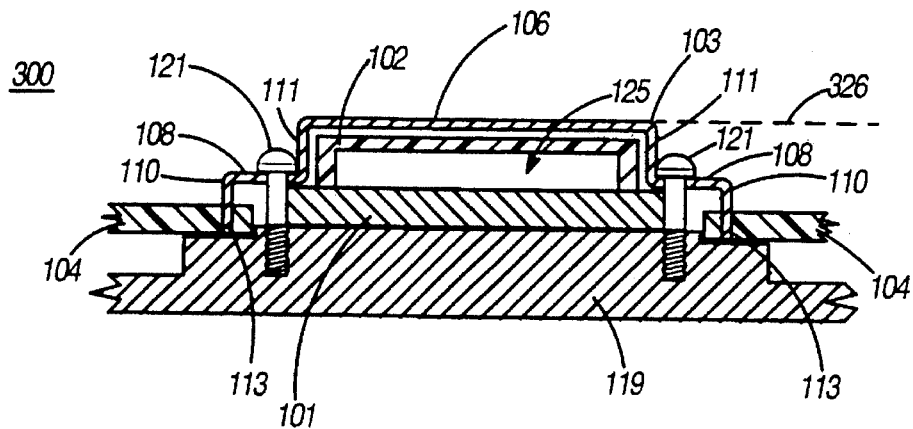
FIG. 3 illustrates a cross-sectional view of the circuit board assembly according to an alternate embodiment of the present invention and shown in a similar view to FIG. 2.

FIG. 3 illustrates a cross-sectional view of the circuit board assembly 100 according to an alternate embodiment of the present invention, referred to generally as circuit board assembly 400, and shown in a similar view to FIG. 2. The circuit board assembly 400 differs from the previous preferred embodiment in both the geometry of a bracket assembly 303 and the sequence of part placement during automated circuit assembly.

The bracket assembly 303 is tooled to reside beneath the RF power amplifier module 125 in circuit board assembly 400. The bracket assembly 303 includes a planar, generally rectangular central plate 306. The central plate 306 of circuit board assembly 400 differs in dimension to the plate 106 of the previous embodiment in FIGS. 1 and 2. The central plate 306 is dimensioned to correspond to the footprint of the heatsink 101 of the RF power amplifier module 125. The central plate 306 further includes a pair of throughholes 306a located at opposing ends that align with the opposing notched ends of the heatsink 101. Screws 121 can pass through the pair of throughholes 306a and notched ends of the heatsink 101 and terminate in threaded holes in the large platform 119; thus, attaching the RF power amplifier module 125 and the bracket assembly 303 to the metal housing 105.

The bracket assembly 303 includes sides 311 extending orthogonally from opposing ends of the central plate 306. The sides 311 have been fabricated to comprise a series of folds: an upward orthogonal fold followed by a downward orthogonal fold. The height of the resulting sides 311 corresponds to the height (thickness) of the heatsink 101.

Flanges 308 extend orthogonally from sides 311 on the same plane as the plate 306. Each of the flanges 308 includes an end foot member 310*a* having an outward extending, curved toe 310*b* that locks the bracket assembly 303 into the corresponding grounded receptacle slot 113 during automated circuit assembly. Although not shown in the cross-sectional view of FIG. 3, each of the flanges 308 also includes a front foot member, similar to the front foot member 110 in FIG. 1, that engages the corresponding grounded receptacle slot 113 in the circuit board 104.

The bracket assembly 303 includes additional elements that are not shown in FIG. 3, but are similar to elements found in the embodiment of FIG. 1. For example, at least one retaining dip, similar to the retaining clips 107 of FIG. 1, would extend upwardly from the back edge of the plate 306. Also, an arm, similar to the arm 123 in FIG. 1, would be folded to first extend upwardly from the plate 306 and then further folded to extend downwardly similar to the sides 311. A flange with an aperture, similar to the flange 109 and the aperture 109*a* of FIG. 1, would extend orthogonally outward from the arm on the same plane as the central plate 306. In conjunction with the sides 311, the retaining dip and the arm, would prevent the RF power amplifier module 125 from moving laterally during automated circuit assembly.

During automated circuit assembly, the bracket assembly 303 must be placed on the circuit board prior to the placement of the RF power amplifier module 125. The bracket assembly 303 is positioned on the breakaway tab 117 (see FIG. 1) of the circuit board 104 in a manner that is self-aligning because the foot members, including end foot members 310*a*, mate with grounded receptacle slots 113 at predetermined locations about the periphery of the breakaway tab 117. Once the end foot members 310*a* are inserted, unwanted vertical and lateral movement of the bracket assembly 303 is prevented.

Next, the RF power amplifier module 125 is positioned on the central plate 306. The geometry of the bracket assembly 303 augments the self-aligning aspect, as previously discussed in reference to FIG. 1, in which the leads 112 fit corresponding receptacle holes 115 of the circuit board 104. The sides 311 as well as the arm and the retaining clip (not shown in FIG. 3, but previously described), all of which extending upward from the edges of the central plate 306, "box-in" the heatsink 101 and, thus, prevent unwanted lateral movement of the RF power amplifier module 125, once positioned.

During final assembly, the circuit board assembly 400 is realized by the removal of the breakaway tab 117, in the manner previously described, and attachment of the RF power amplifier module 125 to the large platform 119 of the metal housing 105 by the screws 121. The circuit board assembly 400 provides an alternative to the circuit board assembly 100 of FIGS. 1 and 2 that also exceeds the heat transfer accomplished by the prior art. The prior art realizes a thermally conductive path of RF power amplifier module-solder-metal plate-metal housing, whereas heat transfer of the circuit board assembly 400 provides the more direct path of the RF power amplifier module 125-the bracket assembly 303-the metal housing 105.

Figure 4:
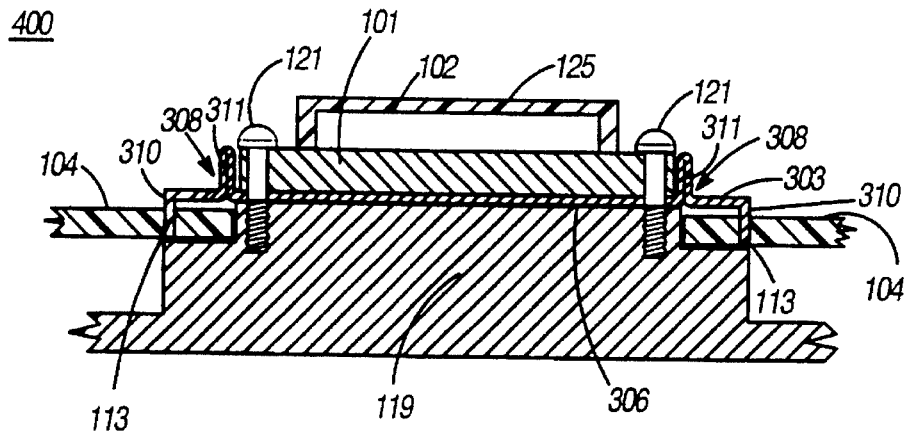
FIG. 4 illustrates a fragmentary top perspective view of an alternate embodiment of a circuit board-rail configuration for use in the present invention.

FIG. 4 illustrates a fragmentary top perspective view of an alternate embodiment of a circuit board 104-rail 418 configuration for use in the present invention. The alternate embodiment for the circuit board 104-rail 418 configuration includes unifying a breakaway tab 417 that extends into notch 422 of the circuit board 104 and the rail 418 that extends along the edge of the circuit board 104. The unified breakaway tab 417-rail 418 is attached to the circuit board 104 by a series of perforated breakaway legs 116. The alternate embodiment illustrated in FIG. 4 is beneficial because this unification allows for easier removal of the rail 418 and the breakaway tab 417 at final assembly.

Figure 5:
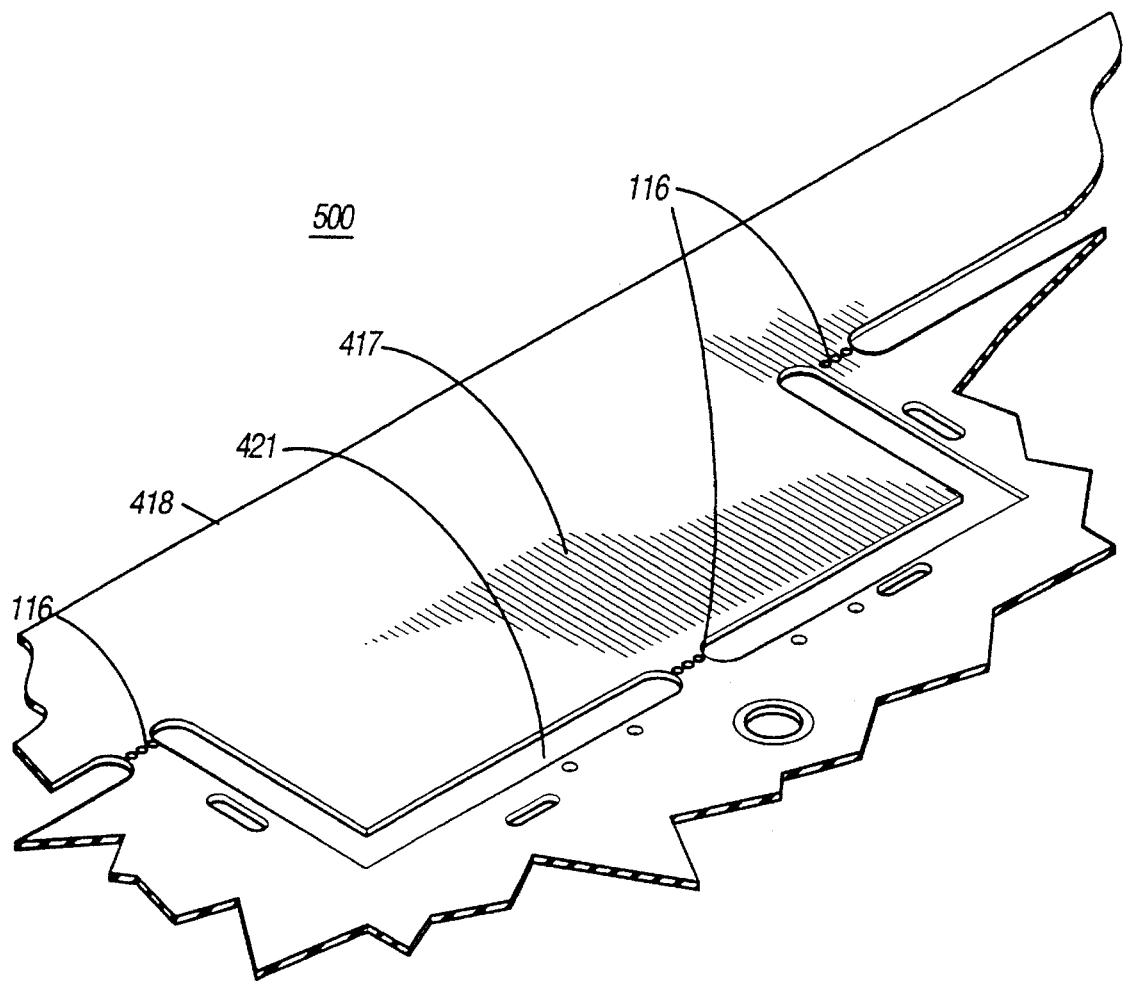
FIG. 5 illustrates a circuit schematic in block diagram form of a cellular telephone including transmitter circuitry that may advantageously utilize the present invention.

FIG. 5 illustrates a circuit schematic in block diagram form of a cellular telephone 500 including transmitter circuitry 130 that may advantageously utilize the present invention. The transmitter circuitry 130 utilizes the RF power amplifier module 125 as described in accordance with FIG. 1. By utilizing the method and apparatuses specified hereinabove, the transmitter circuitry 130 of the cellular telephone 500 may be manufactured via an automated circuit assembly process. The transmitter circuitry 130 together with a microcomputer 140, a receiver 150 and a user interface 160 may comprise the transceiver module of any conventional cellular mobile telephone, such as the Motorola Series IV Cellular Mobile Transceiver. In addition, the transceiver of a cellular mobile telephone functions in conjunction with both a handset 170 having a keypad 171, a microphone 172 and a speaker 173 as well as an antenna 180.

Thus, it can be seen that an RF power amplifier module 125 and a bracket assembly 103 is disclosed, which can be mounted upon the breakaway tab 117 of the circuit board 104 during an automated circuit assembly process and supported throughout the process by the breakaway tab 117. At the conclusion of the automated circuit assembly process, final assembly is initiated and the breakaway tab 117 is removed. The circuit board 104 is then mounted in the metal housing 105 such that the heatsink 101 of the RF power amplifier module 125 is attached directly to the large platform 119 of the metal housing 105. Thus, the circuit board assembly 100 permits maximum heat transfer between the RF power amplifier module 125 and the metal housing 105 while remaining conducive to an automated circuit assembly process.

Although the invention has been described and illustrated in the above description and drawings, it is understood that this description is by example only and that numerous changes and modifications can be made by those skilled in the art without departing from the true spirit and scope of the invention.

We claim:

1. A circuit board assembly adapted to be supported in a housing, the circuit board assembly comprising:

a circuit board having a permanent portion and a breakaway portion;

an electrical module having at least two leads for coupling to the circuit board; and a bracket assembly for coupling to the electrical module and to said permanent portion of the circuit board to align the electrical module at a predetermined location on the circuit board, said breakaway portion of the circuit board extending under the electrical module and the bracket assembly for supporting the electrical module during assembly, said breakaway portion being removable to permit coupling of the electrical module to the housing for maximum heat transfer.

2. A circuit board assembly according to claim 1 wherein the electrical module is an amplifier module.

3. A circuit board assembly according to claim 1 wherein the electrical module is a radio frequency (RF) power amplifier module.

4. A circuit board assembly according to claim 1 wherein the bracket assembly intimately couples the electrical module to a ground of the circuit board.

5. A circuit board assembly according to claim 1 wherein the bracket assembly partially encloses the electrical module during assembly for limiting lateral movement of the electrical module.

6. A circuit board assembly according to claim 1 wherein the bracket assembly includes a central portion having a first side portion, a second side portion, a third side portion, and at least one clip extending substantially orthogonal from the central portion.

7. A circuit board assembly according to claim 6 wherein the at least one clip is substantially "Z"-shaped.

8. A circuit board assembly according to claim 6 wherein the third side portion includes a first flange extending orthogonally outward, the flange being attached to a ground of the circuit board.

9. A circuit board assembly according to claim 6 wherein the first side portion and the second side portion include a second flange and a third flange extending orthogonally outward, the second flange and the third flange each having at least one foot member extending toward the circuit board.

10. A circuit board assembly according to claim 9 wherein the at least one foot member of the second flange and the third flange fits into a corresponding one of a plurality of throughholes in the circuit board.

11. A circuit board assembly according to claim 1 wherein the breakaway portion comprises at least one tab that extends into a notch in the circuit board, the at least one tab has at least one breakaway leg detachably holding the breakaway portion in the notch in the circuit board.

12. A circuit board assembly according to claim 11 wherein the at least one tab has at least one breakaway leg connecting the breakaway portion to a rail.

13. A circuit board assembly according to claim 1 wherein the bracket assembly resides upon the electrical module when the circuit board assembly is fully assembled.

14. A circuit board assembly according to claim 1 wherein the bracket assembly resides substantially below the electrical module when the circuit board assembly is fully assembled.

* * * * *